(12) United States Patent
Yang et al.

(10) Patent No.: US 7,646,248 B2
(45) Date of Patent: Jan. 12, 2010

(54) HARMONIC TUNED DOHERTY AMPLIFIER

(75) Inventors: Youngoo Yang, Gyeonggi-do (KR); Xi Yao, Gyeonggi-do (KR); Hyun Chul Park, Gyeongsangnam-do (KR); Sung Wook Kwon, Seoul (KR)

(73) Assignee: Sungkyunwan University Foundation for Corporate Collaboration, Suwon-si, Gyeonggi-do (KR)

( * ) Notice: Subject to any disclaimer, the term of this patent is extended or adjusted under 35 U.S.C. 154(b) by 0 days.

(21) Appl. No.: 12/034,544

(22) Filed: Feb. 20, 2008

(65) Prior Publication Data

US 2009/0167438 A1 Jul. 2, 2009

(30) Foreign Application Priority Data

Dec. 28, 2007 (KR) ................. 10-2007-0139752

(51) Int. Cl.
*H03F 3/68* (2006.01)
(52) U.S. Cl. .................... 330/295; 330/124 R
(58) Field of Classification Search ............... 330/295, 330/124 R, 84, 126
See application file for complete search history.

(56) References Cited

U.S. PATENT DOCUMENTS 6,472,934 B1 * 10/2002 Pehlke .................. 330/10
6,617,929 B2 * 9/2003 Kim et al. .............. 330/295
6,861,907 B2 * 3/2005 Gotou ................... 330/295

* cited by examiner

*Primary Examiner*—Henry K Choe
(74) *Attorney, Agent, or Firm*—Blakely, Sokoloff, Taylor & Zafman LLP (57) ABSTRACT

Disclosed is a Doherty amplifier including a carrier amplifier to perform a signal amplification operation regardless of a level of an input signal, a peaking amplifier to perform an amplification operation, starting from a high power output where a level of an input signal is equal to or greater than a predetermined level, an output combination circuit to combine and output the outputs of the carrier amplifier and the peaking amplifier, and an input division circuit to divide an input signal into the carrier amplifier and the peaking amplifier, the Doherty amplifier including a carrier amplifier output harmonic impedance tuning network installed at a rear end of the carrier amplifier to tune an output harmonic impedance of the carrier amplifier, and a peaking amplifier output harmonic impedance tuning network installed at a rear end of the peaking amplifier to tune an output harmonic impedance of the peaking amplifier.

12 Claims, 9 Drawing Sheets

Fig. 1

PRIOR ART

Fig. 2

PRIOR ART

HARMONIC TUNED DOHERTY AMPLIFIER

CROSS-REFERENCE TO RELATED APPLICATIONS

The present patent application claims priority from Korean Patent Application No. 10-2007-0139752, filed on Dec. 28, 2007.

TECHNICAL FIELD

The present invention relates to a radio frequency (RF) communication system, and more particularly to a harmonic-tuned Doherty amplifier applied to a base station.

BACKGROUND ART

In many applications, power amplifier design requires high linearity and high efficiency. Generally, linear amplifiers can eliminate most distortion, but have a problem in that efficiency thereof is poor. In this case, when a high-efficiency power amplifier is used, a sufficient RF signal can be provided, even with low DC power, but many harmonic components and a distortion phenomenon may occur in output signals at any time, thereby deteriorating the performance of output RF signals.

As well known in the art, the efficiency of a power amplifier is connected with the output power of the amplifier itself, and high efficiency always is shown at high output power. When a power amplifier is applied to a base station, the power amplifier operates at a few dB back-off from the peak power point in order to satisfy a strict linearity condition, which acts as a main cause of deteriorating the efficiency of the power amplifier. Especially, such a deterioration phenomenon becomes more serious when a signal having a high peak-to-average ratio (PAR), such as in the (W)CDMA or Wibro, is input. In order to relieve such a deterioration phenomenon, various Doherty amplifiers, including a variety of amplifiers, may be employed to implement signals which are efficient and have low distortion over a wide range of signal power.

Figure 1:
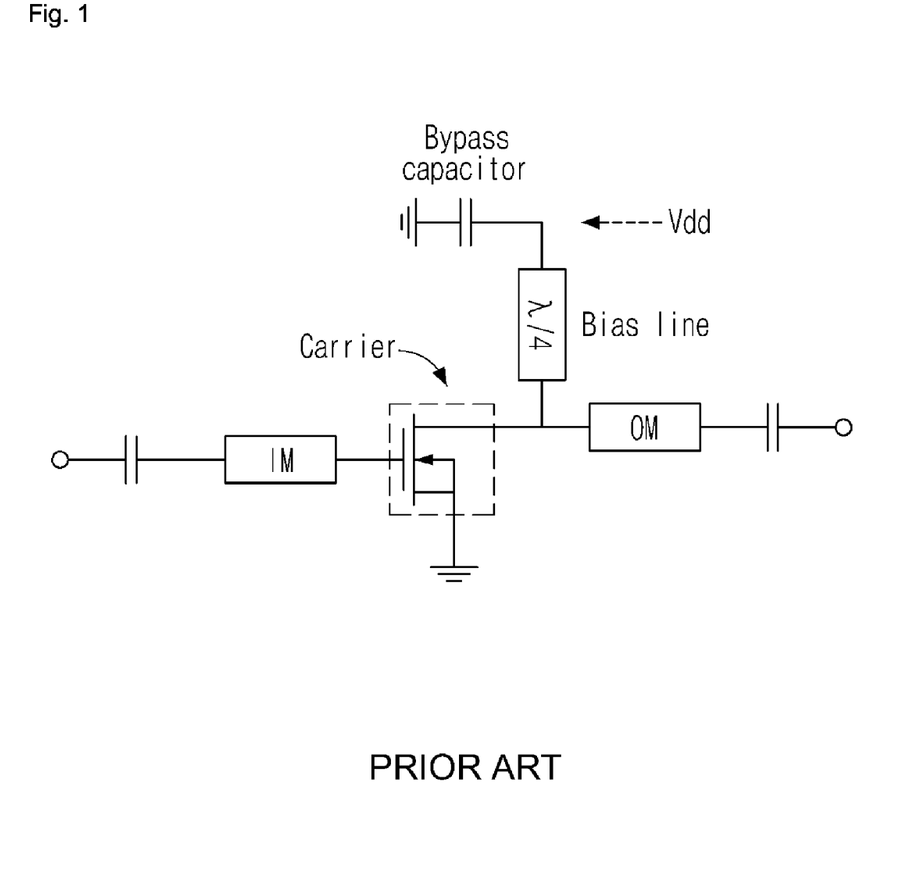
FIG. 1 is a view illustrating a convention single-ended amplifier, which is often used for configuration of a Doherty amplifier.

FIG. 1 is a view illustrating a convention single-ended amplifier, which is often used for configuration of a Doherty amplifier. The single-ended amplifier includes an input matching network for transforming a terminal impedance into an optimum input impedance for a transistor, the transistor for amplifying an input RF signal, a λ/4 line directly-connected to a drain (or collector) of the transistor so that DC voltage can be supplied to the transistor, and an output matching network for transforming a terminal impedance into an optimum output impedance for the transistor.

Figure 2:
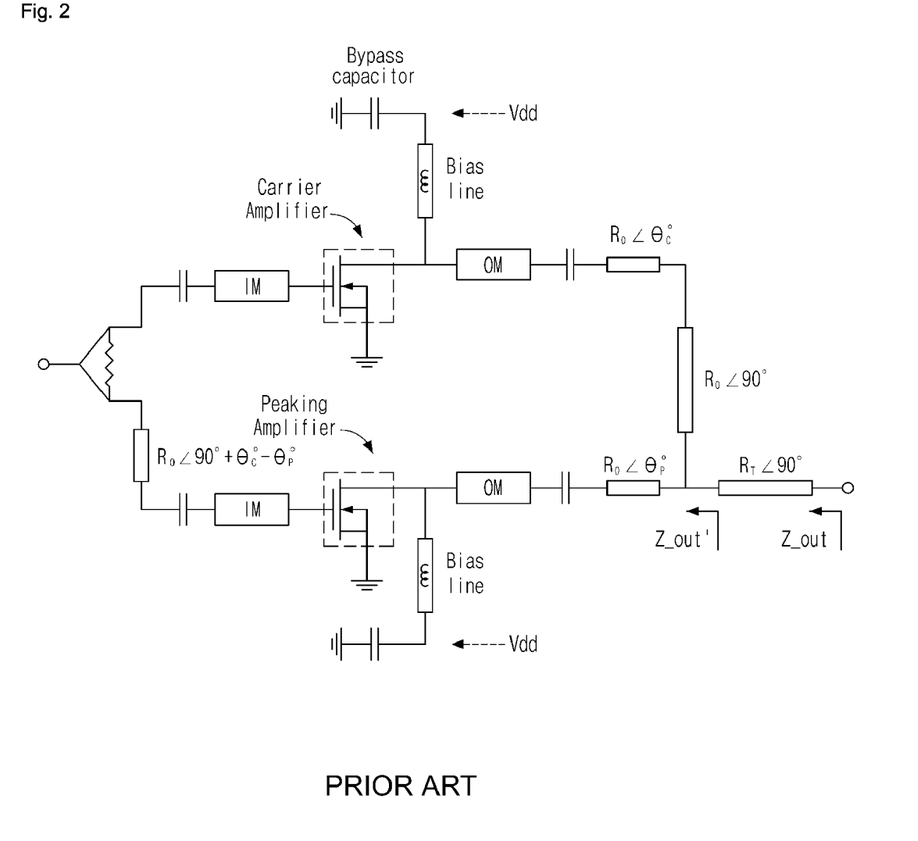
FIG. 2 is a view illustrating the configuration of a conventional Doherty amplifier which uses two identical cells, the illustration of which is given in FIG. 1, as a carrier amplifier and a peaking amplifier, respectively.

FIG. 2 is a view illustrating the configuration of a conventional Doherty amplifier which uses two identical cells, the illustration of which is given in FIG. 1, as a carrier amplifier and a peaking amplifier, respectively. An input RF signal is divided into two equal signals, which are introduced to the carrier amplifier and the peaking amplifier, respectively. At rear ends of output fundamental matching networks of the carrier amplifier and peaking amplifier, output offset lines are added, respectively, to transform a small signal output impedance into a very high value. In addition, in order to accurately perform a load impedance modulation, another λ/4 line is added at a rear end of the output offset line for the carrier amplifier. Thereafter, a carrier and the output of the peaking amplifier are combined with each other through a still another λ/4 line. In order to more efficiently combine the output power, an input offset line for according the output current phase of the carrier amplifier to the output current phase of the peaking amplifier is added.

While the carrier amplifier operates over all power ranges, the peaking amplifier starts to operate at a 6 dB back-off point of a peak power point. In order to satisfy such a condition, the gate bias level of the peaking amplifier is set to be a value less than that of the carrier amplifier. Accordingly, it is possible to improve the general efficiency of the system, without exerting a large influence on the linearity of the amplifier system.

DISCLOSURE

Technical Problem

Therefore, the present invention has been made in view of the above-mentioned problems, and it is an object of the present invention to provide a Doherty amplifier which has an enhanced efficiency with the linearity thereof maintained. That is, by tuning the harmonic impedances of a carrier amplifier and a peaking amplifier, the carrier amplifier has an enhanced performance tolerance, which makes variances in efficiency and linearity small, even if a fundamental load impedance is greater than 50Ω, and the peaking amplifier has a higher gain.

Technical Solution

In order to achieve the above-mentioned object, there is provided a Doherty amplifier which includes: a carrier amplifier for always performing a signal amplification operation regardless of a level of an input signal; a peaking amplifier for performing an amplification operation, starting from a high power output where a level of an input signal is equal to or greater than a predetermined level; an output combination circuit for combining and outputting outputs of the carrier amplifier and the peaking amplifier; and an input division circuit for dividing an input signal into the carrier amplifier and the peaking amplifier, the Doherty amplifier including: a carrier amplifier output harmonic impedance tuning network which is installed at a rear end of the carrier amplifier so as to tune an output harmonic impedance of the carrier amplifier; and a peaking amplifier output harmonic impedance tuning network which is installed at a rear end of the peaking amplifier so as to tune an output harmonic impedance of the peaking amplifier.

According to another aspect of the present invention, there is provided a Doherty amplifier which includes: a carrier amplifier for always performing a signal amplification operation regardless of a level of an input signal; a peaking amplifier for performing an amplification operation, starting from a high power output where a level of an input signal is equal to or greater than a predetermined level; an output combination circuit for combining and outputting outputs of the carrier amplifier and the peaking amplifier; and an input division circuit for dividing an input signal into the carrier amplifier and the peaking amplifier, the Doherty amplifier including: a first input fundamental impedance matching network installed between the input division circuit and the carrier amplifier; a carrier amplifier output harmonic impedance tuning network which is installed between the carrier amplifier and the output combination circuit so as to tune an output harmonic impedance of the carrier amplifier; a second input fundamental impedance matching network installed between the input division circuit and the peaking amplifier; and a peaking amplifier output harmonic impedance tuning network which is installed between the peaking amplifier and the output combination circuit so as to tune an output harmonic impedance of the peaking amplifier.

Preferably, the carrier amplifier output harmonic impedance tuning network tunes a second output harmonic impedance to a near open circuit and turns a third output harmonic impedance to a near short circuit, while the peaking amplifier output harmonic impedance tuning network tunes a second output harmonic impedance to a near open circuit, and tunes a third output harmonic impedance to a near short circuit.

Also, preferably, the carrier amplifier output harmonic impedance tuning network tunes a second output harmonic impedance to a near open circuit and turns a third output harmonic impedance to a near short circuit, while the peaking amplifier output harmonic impedance tuning network tunes a second output harmonic impedance to a near short circuit, and tunes a third output harmonic impedance to a near open circuit.

Advantageous Effects

According to the Doherty amplifier of the present invention, it is possible to overcome the problems of incompletely performing a load modulation and imperfectly eliminating the third harmonic current, which occur in the conventional Doherty amplifier, thereby enhancing the performance and improving the efficiency of the Doherty amplifier.

Also, according to the present invention, the Doherty amplifier using harmonic tuning tunes harmonic impedances of both a carrier amplifier and a peaking amplifier in order to enhance the efficiency of the Doherty amplifier with its linearity maintained, thereby efficiently increasing the efficiency of the Doherty amplifier while satisfying a predetermined linearity condition.

In addition, according to the present invention, the Doherty amplifier using harmonic tuning can further enhance the efficiency of the Doherty amplifier while maintaining the linearity thereof, by tuning harmonic impedances of both a carrier amplifier and a peaking amplifier.

BRIEF DESCRIPTION OF THE DRAWINGS

The foregoing and other objects, features and advantages of the present invention will become more apparent from the following detailed description when taken in conjunction with the accompanying drawings in which.

BEST MODE

Mode for Invention

Figure 3:
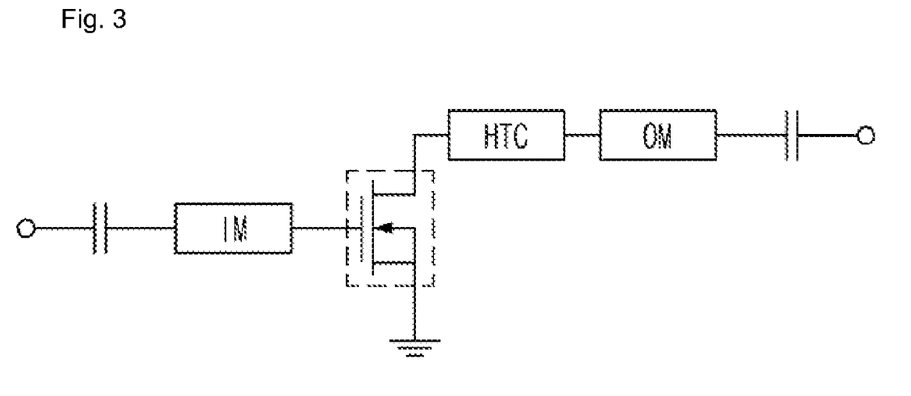
FIG. 3 is a view illustrating the configuration of a harmonic-tuned single-ended amplifier to be used for configuration of a Doherty amplifier according to an exemplary embodiment of the present invention.

FIG. 3 is a view illustrating the configuration of a harmonic-tuned single-ended amplifier to be used for configuration of a Doherty amplifier according to an exemplary embodiment of the present invention. A Doherty power amplifier which is single-ended and uses harmonic tuning according to the present invention includes an input fundamental impedance matching network "IM," a transistor for amplifying an RF signal, an output harmonic impedance tuning network "HTC," an output fundamental impedance matching network "OM," and two DC block, capacitors for preventing a DC short phenomenon.

In the Doherty amplifier shown in FIG. 3, each of the input fundamental impedance matching network "IM" and the output fundamental impedance matching network "OM" may be implemented by any one of circuits shown in FIGS. 7A to 7F, and the output harmonic impedance tuning network "HTC" may be implemented by any one of various circuits shown in FIGS. 4A, 4B, 5A to 5D, and 6A to 6D. By tuning output harmonic impedances, the single-ended amplifier of FIG. 3 can ensure high efficiency. Meanwhile, by applying an output fundamental impedance optimized for both linearity and efficiency, the linearity of the singe-ended power amplifier can be ensured, as well.

Figure 4:
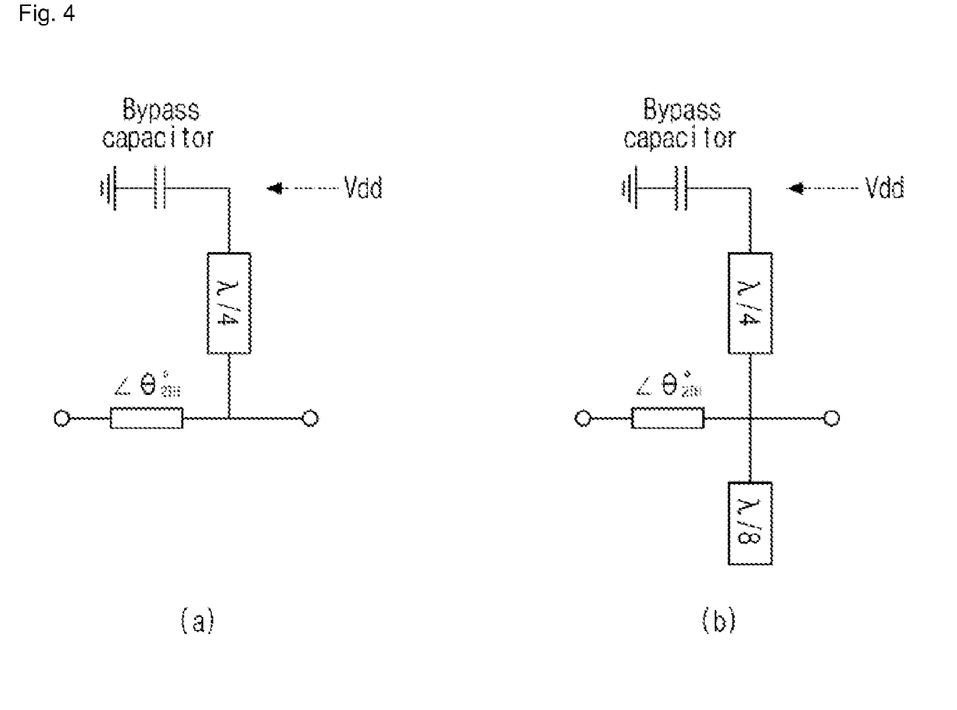
FIGS. 4A and 4B are views illustrating two types of harmonic tuning networks, which tune only second-harmonic impedance and can be applied to Doherty amplifiers shown in FIGS. 8 and 9, according to an exemplary embodiment of the present invention.
Figure 8:
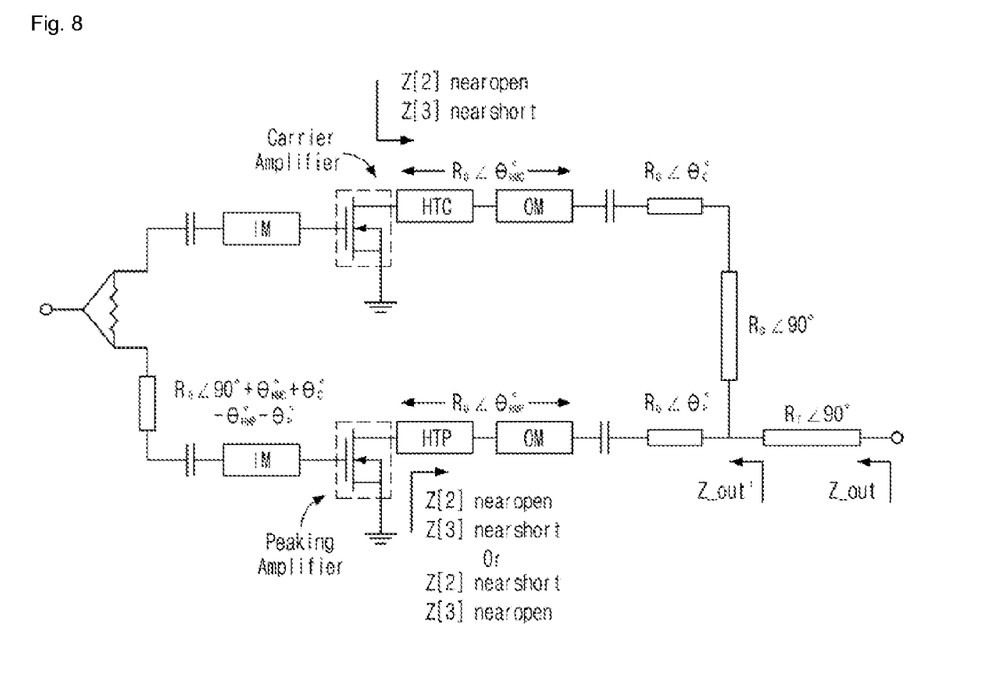
FIG. 8 is a view illustrating the configurations of a Doherty amplifier according to an exemplary embodiment of the present invention.
Figure 9:
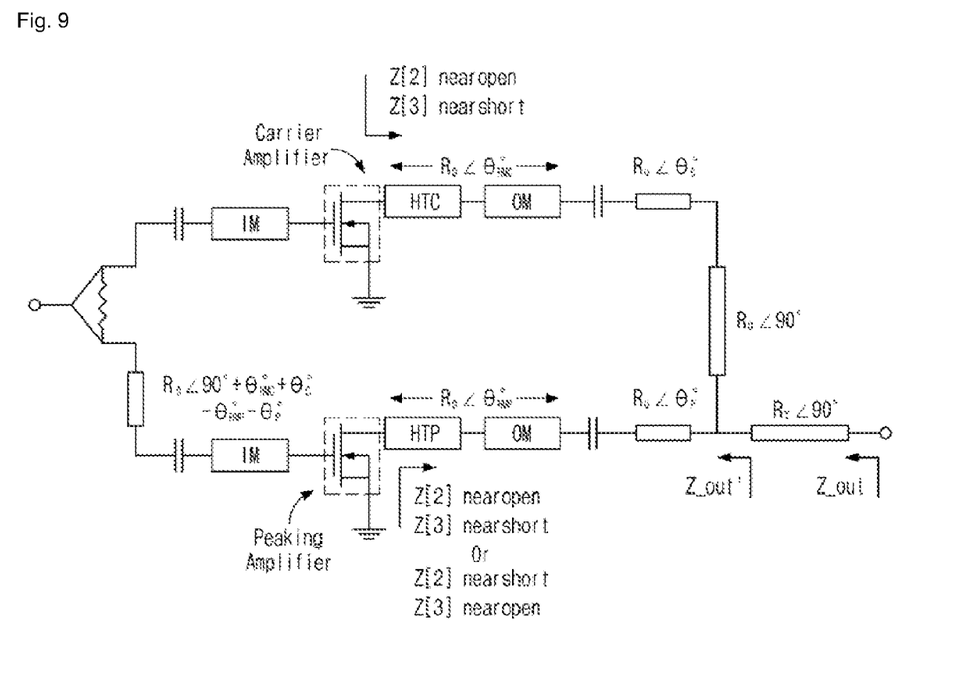
FIG. 9 is a view illustrating the configuration of a Doherty amplifier according to an exemplary embodiment of the present invention.

FIGS. 4A and 4B are views illustrating two types of harmonic tuning networks, which tune only second-harmonic impedance and can be applied to Doherty amplifiers shown in FIGS. 8 and 9, according to an exemplary embodiment of the present invention. Referring to FIG. 4A, since a short λ/4 line (i.e. short ended quarter wave line), which is connected to the ground and is short-circuited, behaves as a short λ/2 line in the case of a second-harmonic frequency, the second-harmonic impedance is seen as a short, even when the second harmonic passes through the short λ/4 line. Since a serial transmission line exerts influence only on a phase, the serial transmission line transforms the second-harmonic impedance, which is seen as a short even when the second harmonic passes through the short λ/4 line, into an impedance "0+jX," which has a zero real part and any imaginary part. The harmonic tuning network shown in FIG. 4B is very similar to that shown in FIG. 4A. Referring to FIG. 4B, a short λ/4 line, located at the same position as in FIG. 4A, allows the second harmonic, which is seen as a short in a harmonic impedance, to show a second-harmonic impedance as a short even after passing through the short λ/4 line. In addition, an open λ/8 line (i.e. open ended lambda of eight line) behaves as an open λ/4 line in the case of the second-harmonic frequency, so that the open λ/8 line transforms a third-harmonic impedance into a short. Thereafter, a serial transmission line transforms the second-harmonic impedance, which is short-circuited at a second-harmonic frequency, into an impedance "0+jX," which has a zero real part and any imaginary part.

Figure 5:
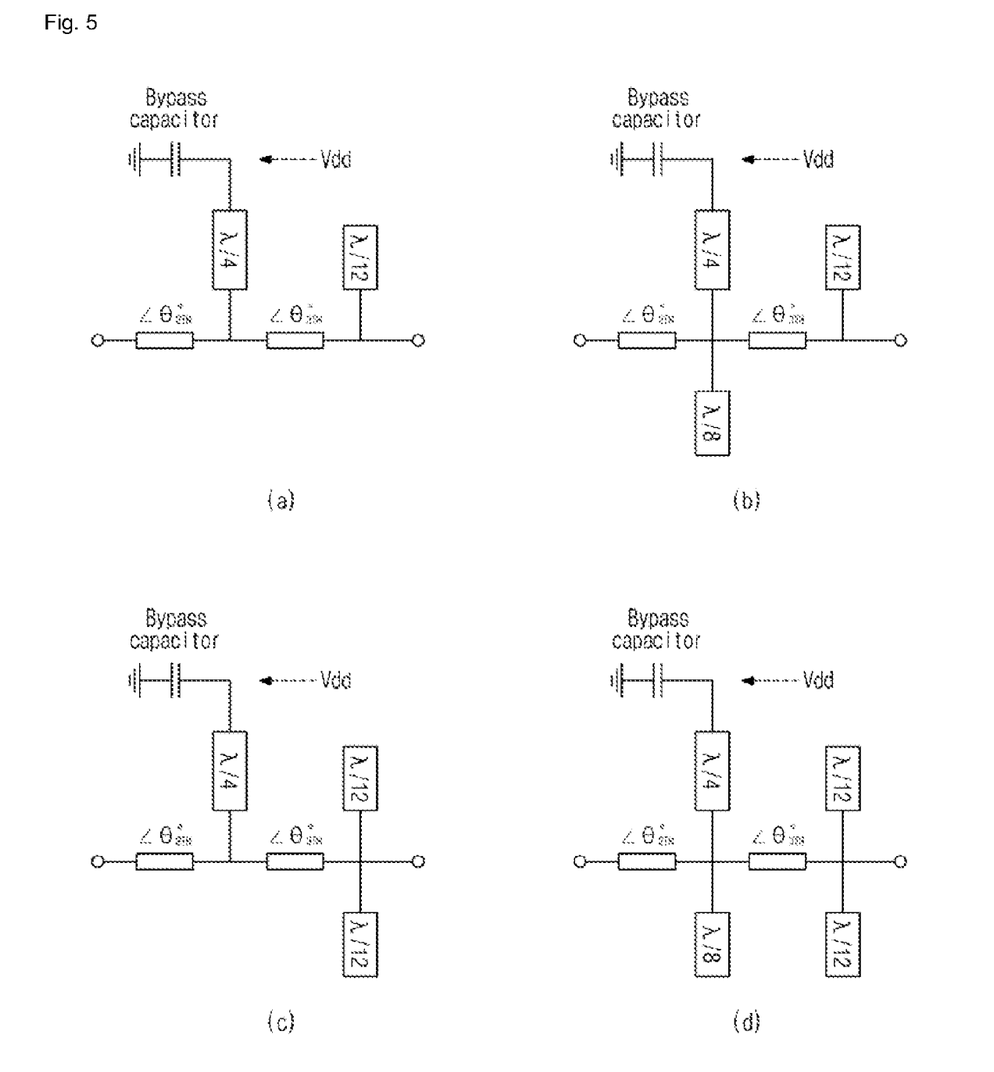
FIGS. 5A to 5D are views illustrating two types of harmonic tuning networks, which tune both the second-harmonic and third-harmonic impedances and can be applied to the Doherty amplifiers shown in FIGS. 8 and 9, according to an exemplary embodiment of the present invention.

FIGS. 5A to 5D are views illustrating two types of harmonic tuning networks, which tune both the second-harmonic and third-harmonic impedances and can be applied to the Doherty amplifiers shown in FIGS. 8 and 9, according to an exemplary embodiment of the present invention. FIGS. 5A to 5D illustrate four types of harmonic tuning networks in which a second-harmonic tuning network is positioned at a front end of a third-harmonic tuning network. That is, FIG. 5A illustrates a configuration including a single second-harmonic short line and a single third-harmonic short line, FIG. 5B illustrates a configuration including a balanced second-harmonic short line and a single third-harmonic short line, FIG. 5C illustrates a configuration including a single second-harmonic short line and a balanced third-harmonic short line, and FIG. 5D illustrates a configuration including a balanced second-harmonic short line and a balanced third-harmonic short line. Referring to FIG. 5A, a short $\lambda/4$ line transforms a second-harmonic impedance from shore to short at a second-harmonic frequency, and a serially-connected transmission line transforms the short-circuited second-harmonic impedance into an impedance which has a zero real part and any imaginary part at the second-harmonic frequency. Since an open $\lambda/12$ line behaves as an open $\lambda/4$ line in the case of a third-harmonic impedance, the open $\lambda/12$ line transforms the third-harmonic impedance from open to short at a third-harmonic frequency, and a serial transmission line and the prior second-harmonic tuning network transform the short-circuited third-harmonic impedance into an impedance having a zero real part and any imaginary part at the third-harmonic frequency. A harmonic tuning network shown in FIG. 5B is similar to that shown in FIG. 5A, except that an open $\lambda/8$ line is additionally connected to the short $\lambda/4$ line in order to implement a short at the second-harmonic frequency. A harmonic tuning network shown in FIG. 5C is similar to that shown in FIG. 5A, except that two $\lambda/12$ lines of an open signal scheme are used to implement a short at the second-harmonic frequency. A harmonic tuning network shown in FIG. 5D is similar to that shown in FIG. 5C, except that an open $\lambda/8$ line is additionally connected to the short $\lambda/4$ line in order to implement a short at the second-harmonic frequency.

Figure 6:
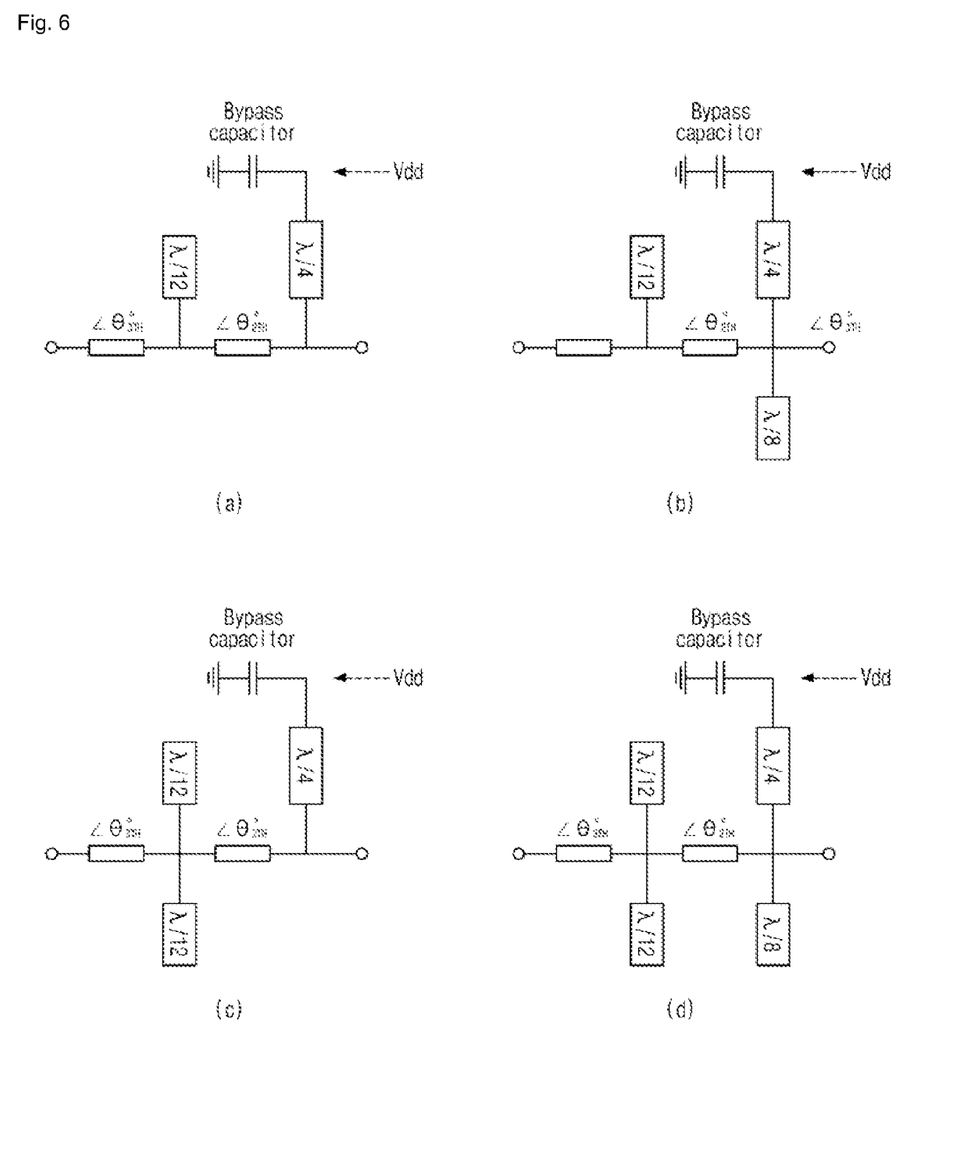
FIGS. 6A to 6D are views illustrating two types of harmonic tuning networks, which tune both the second-harmonic and third-harmonic impedances and can be applied to the Doherty amplifiers shown in FIGS. 8 and 9, according to an exemplary embodiment of the present invention.

FIGS. 6A to 6D are views illustrating two types of harmonic tuning networks, which tune both the second-harmonic and third-harmonic impedances and can be applied to the Doherty amplifiers shown in FIGS. 8 and 9, according to an exemplary embodiment of the present invention. FIGS. 6A to 6D illustrate four types of harmonic tuning networks, in which a third-harmonic tuning network is positioned at a front end of a second-harmonic tuning network. That is, FIG. 6A illustrates a configuration including a single second-harmonic short line and a single third-harmonic short line, FIG. 6B illustrates a configuration including a balanced second-harmonic short line and a single third-harmonic short line, FIG. 6C illustrates a configuration including a single second-harmonic short line and a balanced third-harmonic short line, and FIG. 6D illustrates a configuration including a balanced second-harmonic short line and a balanced third-harmonic short line.

The harmonic tuning networks shown in FIGS. 6A, 6B, 6C and 6D are similar to those shown in FIGS. 5A, 5B, 5C and 5D, respectively, except that each third-harmonic impedance tuning network is positioned at a front end of each corresponding second-harmonic tuning network.

Figure 7:
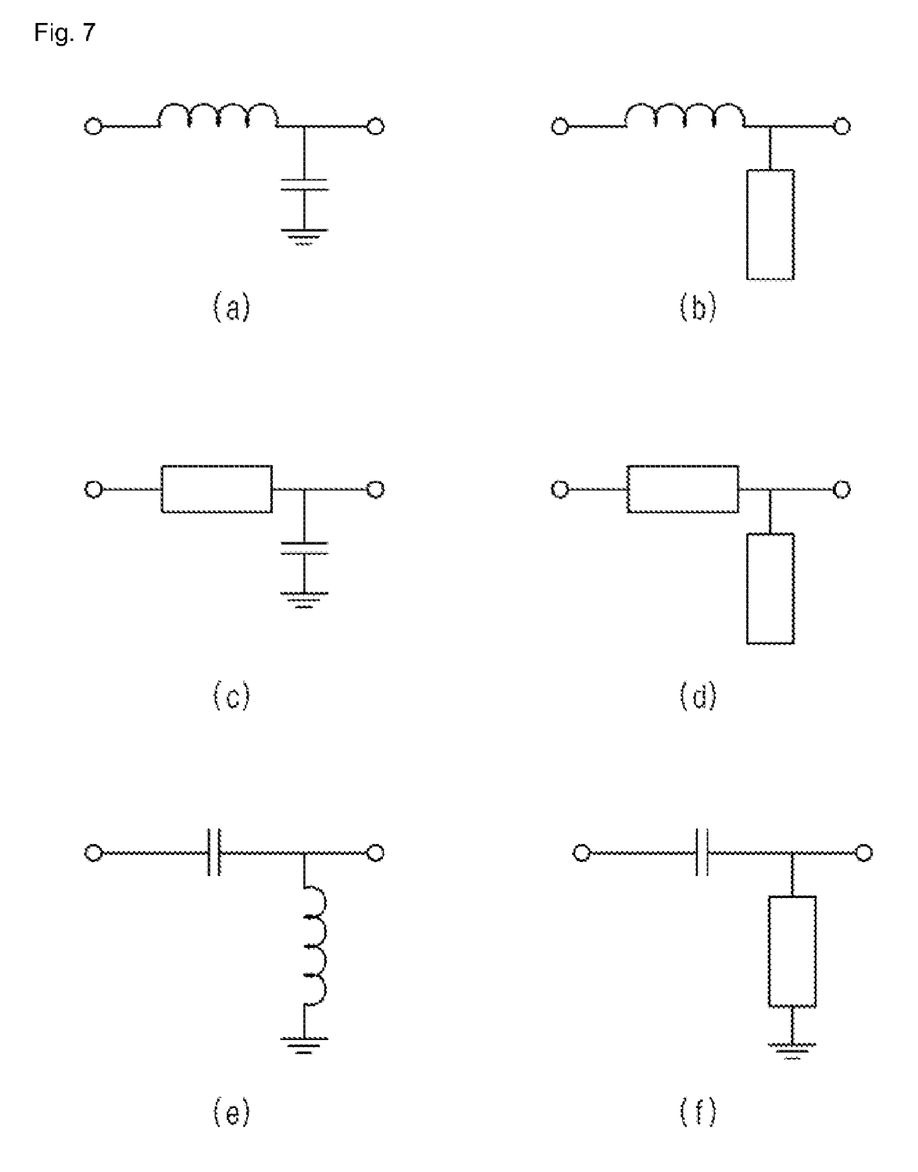
FIGS. 7A to 7F are views illustrating six types of input/output fundamental impedance matching networks, which can be applied to the Doherty amplifiers shown in FIGS. 2, 8 and 9.

FIGS. 7A to 7F are views illustrating six types of input/output fundamental impedance matching networks, which can be applied to the Doherty amplifiers shown in FIGS. 2, 8 and 9. FIGS. 7A to 7D illustrate four types of low-pass matching networks, and FIGS. 7E and 7F illustrate two types of high-pass matching networks. That is, FIGS. 7A to 7F illustrate six types of input/output snatching networks, wherein FIG. 7A illustrates a configuration including a serial inductor and a shunt capacitor, FIG. 7B illustrates a configuration including a serial inductor and a shunt open stub, FIG. 7C illustrates a configuration including a serial transmission line and a shunt capacitor, FIG. 7D illustrates a configuration including a serial transmission line and a shunt open stub, FIG. 7E illustrates a configuration including a serial capacitor and a shunt inductor, and FIG. 7F illustrates a configuration including a serial capacitor and a shunt short stub.

FIG. 8 is a view illustrating the configuration of a Doherty amplifier according to an exemplary embodiment of the present invention. FIG. 8 illustrates the configuration of a Doherty amplifier including harmonic tuning networks for both the carrier amplifier and the peaking amplifier. The single-ended power amplifier shown in FIG. 3 is used as the carrier amplifier. In order to prevent power leakage, a separate offset line is added at a rear end of an output DC blocking capacitor for transforming a small signal output impedance into an infinite value. Also, in order to accurately perform impedance modulation, a $\lambda/4$ line is added at a rear end of an output offset line of the carrier amplifier. Another type of single-ended power amplifier shown in FIG. 3 is employed as a peaking amplifier. In addition, in order to transform a small signal output impedance into an infinite value, a separate offset line is added at a rear end of an output DC blocking capacitor. Then, the outputs of the carrier amplifier and peaking amplifier are combined as a load impedance through another $\lambda/4$ line (that is, an impedance transformer for transforming impedance "Z_out'", which is an impedance at a point where signals are combined, into a desired impedance of 50Ω, that is, into "Z_out," as shown in FIGS. 2, 8 and 9). In order to achieve a complete power combination, an input offset line is inserted at a front end of an input DC blocking capacitor.

For the Doherty amplifier of FIG. 8, an amplifier having a good performance in gain expansion must be selected as the peaking amplifier. The "gain expansion" represents that an amplifier does not have a uniform power gain at both low and high output power points, but has a low power gain with respect to low output power while having a high power gain with respect to high output power. That is, the peaking amplifier in the Doherty amplifier must not operate at low output power, and must operate to flow the same amount of current as that of the carrier amplifier at high output power. Therefore, as the peaking amplifier has superior performance in gain expansion, the ON/OFF operation of the peaking amplifier can be ensured, which ensuring that a load modulation is accurately performed at low output power points. Since such a gain expansion is generated better when a second harmonic impedance is short-circuited and a third harmonic impedance is open-circuited, than the opposite case, an amplifier having such a harmonic tuning circuit is selected as the peaking amplifier. In contrast, when a second harmonic impedance is open-circuited and a third harmonic impedance is short-circuited, excellent linearity and efficiency are obtained over a wide output power range, so that an amplifier having such a harmonic tuning circuit may be selected as a carrier amplifier or a peaking amplifier.

FIG. 9 is a view illustrating the configuration of a Doherty amplifier according to an exemplary embodiment of the present invention. FIG. 9 illustrates the configuration of a Doherty amplifier, wherein an output matching network is contained in a harmonic tuning network. Similar to the Doherty amplifier of FIG. 8, output harmonic tuning networks are used as both a carrier amplifier and a peaking amplifier. However, in some cases, a harmonic tuning network may complete an output fundamental impedance matching, as well as provide an appropriate output harmonic impedance. Therefore, in this case, it is possible to omit output fundamental matching networks, as shown in FIG. 9. The other components shown in FIG. 9 are the same as those shown in FIG. 8. A carrier output harmonic impedance tuning network must tune a second harmonic impedance to a near open circuit, and tune a third harmonic impedance to a near short circuit. In addition, a peaking output harmonic impedance tuning network must tune the second harmonic impedance to a near short circuit, and tune the third harmonic impedance to a near open circuit, or the peaking output harmonic impedance tuning network must tune the second and third harmonic impedances in the opposite manner thereto.

INDUSTRIAL APPLICABILITY

While the invention has been shown and described with reference to a certain exemplary embodiment thereof, it will be understood by those skilled in the art that various changes in form and details may be made therein without departing from the spirit and scope of the invention. Therefore, the spirit and scope of the present invention must be defined not by described embodiments thereof but by the appended claims and equivalents of the appended claims.

What is claimed:

1. A Doherty amplifier which comprises:
   a carrier amplifier for always performing a signal amplification operation regardless of a level of an input signal;
   a peaking amplifier for performing an amplification operation, starting from a high power output where a level of an input signal is equal to or greater than a predetermined level;
   an output combination circuit for combining and outputting outputs of the carrier amplifier and the peaking amplifier; and
   an input division circuit for dividing an input signal into the carrier amplifier and the peaking amplifier, wherein the Doherty amplifier includes
      a carrier amplifier output harmonic impedance tuning network which is installed at a rear end of the carrier amplifier so as to tune an output harmonic impedance of the carrier amplifier, wherein the carrier amplifier output harmonic impedance tuning network tunes a second output harmonic impedance to a near open circuit and a third output harmonic impedance to a near short circuit, and
      a peaking amplifier output harmonic impedance tuning network which is installed at a rear end of the peaking amplifier so as to tune an output harmonic impedance of the peaking amplifier.

2. The Doherty amplifier as claimed in claim 1, wherein the peaking amplifier output harmonic impedance tuning network tunes a second output harmonic impedance to a near open circuit.

3. The Doherty amplifier as claimed in claim 1, wherein, on an output path of the peaking amplifier, a harmonic tuning network for tuning a third output harmonic impedance to a near short circuit is installed.

4. The Doherty amplifier as claimed in claim 1, wherein the peaking amplifier output harmonic impedance tuning network tunes a second output harmonic impedance to a near short circuit.

5. The Doherty amplifier as claimed in claim 1, wherein the peaking amplifier output harmonic impedance tuning network tunes a third output harmonic impedance to a near open circuit.

6. A Doherty amplifier comprising:
   a carrier amplifier for always performing a signal amplification operation regardless of a level of an input signal;
   a peaking amplifier for performing an amplification operation, starting from a high power output where a level of an input signal is equal to or greater than a predetermined level;
   an output combination circuit for combining and outputting outputs of the carrier amplifier and the peaking amplifier; and
   an input division circuit for dividing an input signal into the carrier amplifier and the peaking amplifier, wherein the Doherty amplifier includes
      a first input fundamental impedance matching network installed between the input division circuit and the carrier amplifier;
      a carrier amplifier output harmonic impedance tuning network which is installed between the carrier amplifier and the output combination circuit so as to tune an output harmonic impedance of the carrier amplifier, wherein the carrier amplifier output harmonic impedance tuning network tunes a second output harmonic impedance to a near open circuit and a third output harmonic impedance to a near short circuit;
      a second input fundamental impedance matching network installed between the input division circuit and the peaking amplifier; and
      a peaking amplifier output harmonic impedance tuning network which is installed between the peaking amplifier and the output combination circuit so as to tune an output harmonic impedance of the peaking amplifier.

7. The Doherty amplifier as claimed in claim 6, wherein the peaking amplifier output harmonic impedance tuning network tunes a second output harmonic impedance to a near open circuit.

8. The Doherty amplifier as claimed in claim 6, wherein, on an output path of the peaking amplifier, a harmonic tuning network for tuning a third output harmonic impedance to a near short circuit is installed.

9. The Doherty amplifier as claimed in claim 6, wherein the peaking amplifier output harmonic impedance tuning network tunes a second output harmonic impedance to a near short circuit.

10. The Doherty amplifier as claimed in claim 6, wherein the peaking amplifier output harmonic impedance tuning network tunes a third output harmonic impedance to a near open circuit.

11. The Doherty amplifier as claimed in claim 6, further comprising a first output fundamental impedance matching network between the carrier amplifier output harmonic impedance tuning network and the output combination circuit.

12. The Doherty amplifier as claimed in claim 11, further comprising a second output fundamental impedance matching network between the peaking amplifier output harmonic impedance tuning network and the output combination circuit.

* * * * *